United States Patent [19]

McShane

[11] Patent Number: 5,311,057
[45] Date of Patent: May 10, 1994

[54] LEAD-ON-CHIP SEMICONDUCTOR DEVICE AND METHOD FOR MAKING THE SAME

[75] Inventor: Michael B. McShane, Austin, Tex.
[73] Assignee: Motorola Inc., Schaumburg, Ill.
[21] Appl. No.: 982,549
[22] Filed: Nov. 27, 1992
[51] Int. Cl.[5] .................. H01L 23/02; H01L 23/522; H01L 23/49; H01L 29/44
[52] U.S. Cl. ..................... 257/676; 257/677; 257/691; 257/692; 257/723; 257/762; 257/765; 257/781; 257/784
[58] Field of Search .................. 257/701–723, 257/724, 758, 781, 784, 666, 676, 698, 700, 705, 759, 762, 765, 677, 691, 692

[56] References Cited

U.S. PATENT DOCUMENTS

| | | | |
|---|---|---|---|
| 4,551,746 | 11/1985 | Gilbert et al. | 257/706 |
| 4,903,113 | 2/1990 | Frankeny et al. | 357/70 |
| 4,965,654 | 10/1990 | Karner et al. | 357/70 |
| 4,994,936 | 2/1991 | Hernandez | 361/306 |
| 5,049,979 | 9/1991 | Hashemi et al. | 257/723 |
| 5,067,005 | 11/1991 | Michii et al. | 257/796 |
| 5,089,876 | 2/1992 | Ishioka | 257/659 |
| 5,089,878 | 2/1992 | Lee | 357/71 |
| 5,140,496 | 8/1992 | Heinks et al. | 257/701 |
| 5,200,364 | 4/1993 | Loh | 257/724 |
| 5,214,845 | 6/1993 | King et al. | 29/841 |
| 5,252,854 | 10/1993 | Arita et al. | 257/691 |

Primary Examiner—Jerome Jackson
Assistant Examiner—Alice W. Tang
Attorney, Agent, or Firm—Patricia S. Goddard

[57] ABSTRACT

A lead-on-chip (LOC) semiconductor device (10) has an integral decoupling capacitor in the form of a capacitor tape (20) attached to an active surface (14) of a semiconductor die (12). The capacitor tape includes two adhesive layers (22 and 24) to bond the die to the capacitor tape and to a plurality of leads (18). The tape also includes two conductive layers (26 and 28), made for instance of copper foil, which serve as the two electrodes of the capacitor. The electrodes are separated by a dielectric layer (30) which in one embodiment comprises barium-titanate ($BaTiO_3$). The electrodes of the capacitor are electrically coupled to appropriate power and ground leads of the device by bonding wires (36 and 40) and to appropriate bonding pads (16) also by bonding wires (38 and 42). The bonding wires can be configured using any of three available wiring options. The present invention can also be implemented in a chip-on-lead (COL) device.

17 Claims, 2 Drawing Sheets

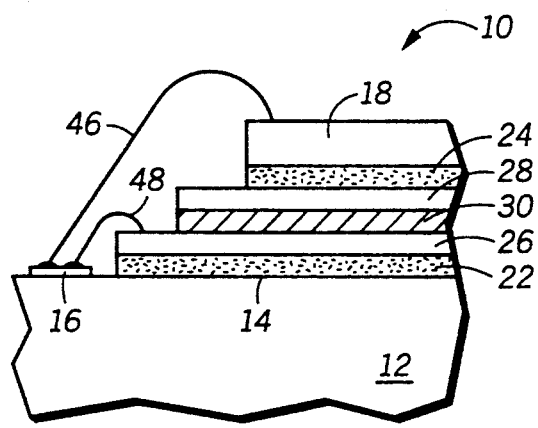
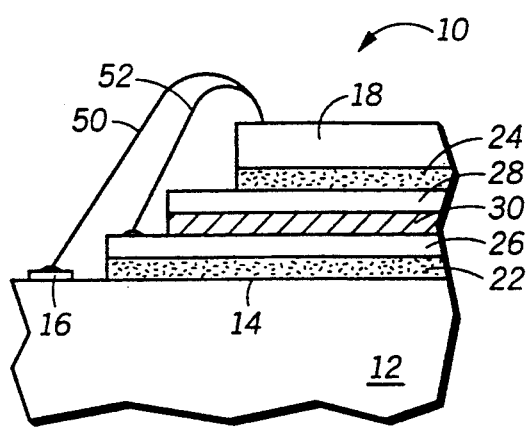
*FIG.4*    *FIG.5*
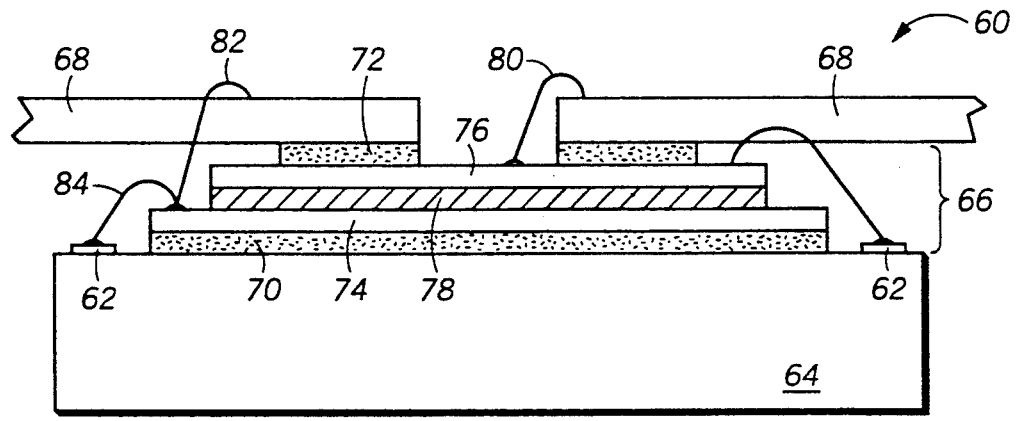
*FIG.6*
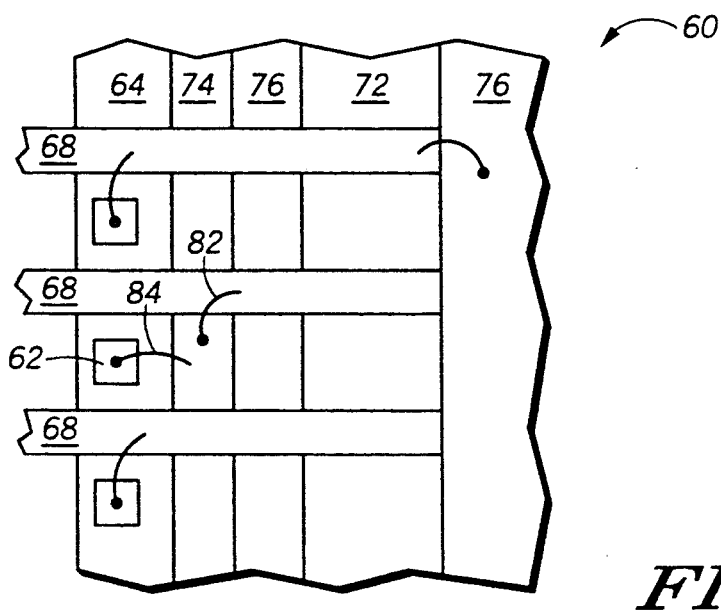
*FIG.7*

LEAD-ON-CHIP SEMICONDUCTOR DEVICE AND METHOD FOR MAKING THE SAME

FIELD OF THE INVENTION

The present invention relates generally to semiconductor devices, and more specifically to lead-on-chip semiconductor devices and methods for making the same.

BACKGROUND OF THE INVENTION

Lead-on-chip (LOC) semiconductor devices are gaining widespread acceptance in the semiconductor industry, particularly in the area of semiconductor memories. LOC devices are resin encapsulated devices having leads attached directly above an active surface of a semiconductor die. Thus, a lead frame for LOC devices does not include a flag or die mounting paddle. Instead, the die is adhesively bonded directly to the leads. Once attached to the die, the leads are wire bonded to corresponding bonding pads on the active surface of the die. In some devices, bonding pads are located along a centerline of the die whereas in other devices peripheral bonding pads are used.

An on-going problem with many semiconductor devices, including some LOC devices, is that of simultaneous switching noise. Frequent current changes from switching circuits in a device results in fluctuations or transients in the device's power distribution system. As the switching speeds increase and as the number of circuits increases, the problem of noise is worsened. Since semiconductor manufacturers are continually striving for denser and faster circuits, switching noise is a serious and continuing problem.

The most accepted way to suppress the effects of simultaneous switching noise is to use a decoupling capacitor coupled to ground and power distributions of a device. The decoupling capacitor stores charge which would otherwise distort power distribution. While decoupling capacitors are more or less the accepted way to reduce switching noise, the manner in which a decoupling capacitor is implemented is quite varied. One method of using a decoupling capacitor is to use a capacitor which is external to the device itself, or in other words one which is located outside of a package body. A problem with external decoupling capacitors is that the distance between the capacitor and the die limits the reduction in inductance, thereby limiting the reduction of switching noise. Ideally, a decoupling capacitor is located as close to a die as possible. Another disadvantage with external decoupling capacitors is that external devices occupy board space which could otherwise be used for active components. Device density on a user board is of critical importance in achieving a compact product, so many users are reluctant to employ external decoupling capacitors.

Decoupling capacitors other than external capacitors are also known in the semiconductor industry. For instance, "close-attach" decoupling capacitors are discrete ceramic decoupling capacitors mounted directly to a semiconductor die and electrically coupled to ground and power bonding pads of the die. The die and decoupling capacitor are encased in a cavity type package. Another type of decoupling capacitor used in the industry is a decoupling capacitor attached below a flag or die paddle of a conventional metal lead frame. These decoupling capacitors typically include electrodes comprised of the lead frame material (e.g. copper or iron-nickel alloys) and a ceramic dielectric layer between the electrodes. The electrodes include tabs which are bonded to power and ground leads of the lead frame.

Each of the known decoupling capacitors described above are not particularly suitable for use in LOC devices. Since there is no flag or die paddle in an LOC device, a decoupling capacitor cannot be attached thereto. While it is possible to incorporate a decoupling capacitor beneath a die in an LOC device in a manner similar to attaching a decoupling capacitor beneath a flag, this would undesirably increase the profile or thickness of the device. Also, a close-attach capacitor is not suitable because there is no room on a die's active surface in an LOC device because the leads extend across the active surface. An external capacitor can be used in conjunction with an LOC device, but as circuit density and switching speeds increase, the effectiveness of an external decoupling capacitor is diminished.

SUMMARY OF THE INVENTION

The present invention overcomes many of the problems associated with employing decoupling capacitors in an LOC device. In one form of the invention, a semiconductor device has a semiconductor die having a surface and a plurality of bonding pads. The device also has a capacitor tape having a first and a second adhesive layer, a first and a second capacitor electrode between the first and second adhesive layers, and a dielectric layer between the first and second capacitor electrodes. The first adhesive layer of the capacitor tape is attached to the surface of the die. A plurality of leads is attached to the second adhesive layer of the capacitor tape. A first lead of the plurality of leads is electrically coupled to the first capacitor electrode and to a first bonding pad of the plurality of bonding pads, while a second lead of the plurality of leads is electrically coupled to the second capacitor electrode and to a second bonding pad of the plurality of bonding pads. The first lead in the device is a ground lead whereas the second lead is a power lead. Also in accordance with the present invention is a method for making such a device.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIG. 4 is a cross-sectional view of a portion of an LOC semiconductor device in accordance with the present invention, demonstrating one option for electrically coupling either a power or a ground lead to a semiconductor die and to a corresponding electrode of a decoupling capacitor.

FIG. 5 is a cross-sectional view of a portion of an LOC semiconductor device in accordance with the present invention, demonstrating another option for electrically coupling either a power or a ground lead to a semiconductor die and to a corresponding electrode of a decoupling capacitor.

FIG. 6 is a cross-sectional view of a portion of an LOC semiconductor device also in accordance with the present invention, wherein a decoupling capacitor is used in conjunction with peripheral bonding pads.

FIG. 7 is a top down view of a portion of the semiconductor device of FIG. 6.

DETAILED DESCRIPTION OF A PREFERRED EMBODIMENT

The present invention incorporates a decoupling capacitor internally in a lead-on-chip (LOC) device. More specifically, a decoupling capacitor is incorporated into an adhesive tape which is used to adhesively bond leads to an active surface of a semiconductor die. One advantage of the present invention is that the internal decoupling capacitor is located adjacent to an active surface of a semiconductor die, thereby providing an effective reduction in inductance and simultaneous switching noise. Furthermore, the decoupling capacitor is very thin so that the thickness or profile of the LOC device is kept small. Moreover, the dielectric layer within the decoupling capacitor is very thin to establish high capacitance. Yet another advantage of the present invention is that no additional processing steps are necessary to manufacture an LOC device in accordance with the present invention. Conventional LOC devices require one or more steps to adhesively bond leads to a die surface. The present invention can be practiced using these same steps.

Figure 1:
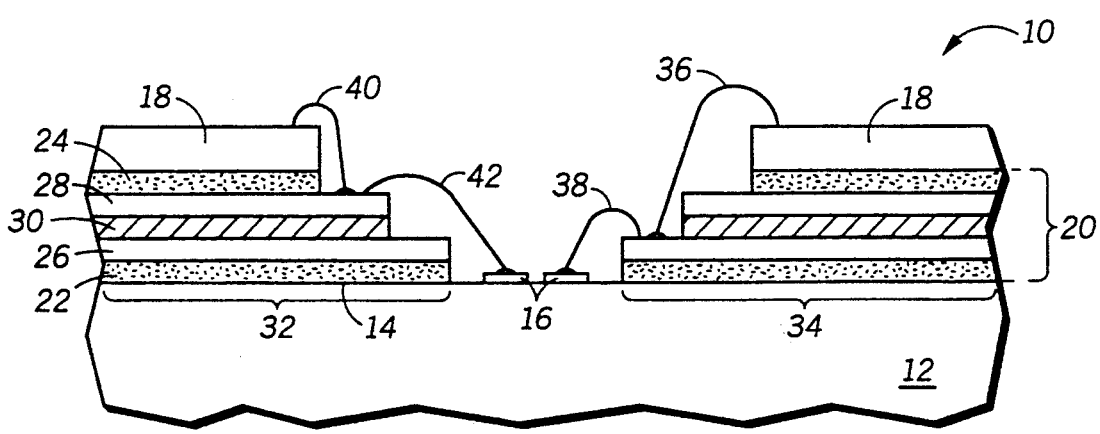
FIG. 1 is a cross-sectional view of a portion of an LOC semiconductor device in accordance with the present invention, wherein a decoupling capacitor is used in conjunction with centrally located bonding pads.

Illustrated in FIG. 1 is a portion of an LOC semiconductor device 10 in accordance with the present invention. Device 10 includes a semiconductor die 12 having an active surface 14 and a plurality of centrally located bonding pads 16. In a preferred embodiment, die 12 is an integrated circuit memory chip although other types of integrated circuits can instead be used in accordance with the present invention. Device 10 also includes a plurality of conductive leads 18. Leads 18 are part of a conventional lead frame (not fully illustrated) used in LOC devices. Leads 18 are adhesively attached to active surface 14 of die 12 by a capacitor tape 20. Conventional adhesive tapes used in LOC devices usually consist of a polyimide layer having an adhesive coating on both top and bottom surfaces of the polyimide. Capacitor tape 20, in contrast, includes a first adhesive layer 22, a second adhesive layer 24, a first conductive layer 26 which serves as a first electrode of capacitor tape 20, a second conductive layer 28 which serves as a second electrode of capacitor tape 20, and a dielectric layer 30 located between the two electrodes.

In order to keep the overall thickness of device 10 small and to improve the decoupling effect, capacitor tape 20 should be made as thin as possible. In a preferred embodiment, conductive layers 26 and 28 of capacitor tape 20 are formed of copper foil and are, for example, on the order of 0.7–1.4 mils (0.018–0.036 mm) if using 0.5–1.0 oz copper. Adhesive layers 22 and 24 are preferably 0.5–1.0 mils (0.013–0.025 mm) and are made from conventional thermoplastic or thermosetting adhesives used on adhesive tapes in LOC devices. Characteristics of dielectric layer 30 are described below.

The capacitance of tape 20 in general is governed by the following equation:

$$C = \frac{K\epsilon_o A}{d}$$

where K is the dielectric constant of dielectric layer 30, $\epsilon_o$ is the permittivity of free space ($8.854 \times 10^{-12}$ $C^2 N^{-1} m^{-2}$), A is the area of capacitor tape 20, and d is the thickness of dielectric layer 30. From the above equation, it follows that capacitance is higher when the K and A are large and d is small. Accordingly, dielectric layer 30 is preferably as thin as possible and made of a material having a high dielectric constant. While many different dielectric materials can be used in capacitor tape 20, the exact material and material thickness should depend upon the desired capacitance, such that $K/d = C\epsilon_o A$. In integrated circuit applications in which a material having a relatively low dielectric constant will suffice, a polyimide material may be used ($K \approx 3.5$). On the other hand, devices with very dense circuitry and fast switching times may require a much higher capacitance. For these devices, a material with a much higher dielectric constant, for example a dielectric constant greater than approximately thirty, is preferred. One such material is barium-titanate ($BaTiO_3$). A barium-titanate filled plastic suitable for use with the present invention has a dielectric constant of about fifty ($K \approx 50$) and is commercially available from Sohio Corporation of Cleveland Ohio.

As evident from the above equation, the thickness of dielectric layer 30 will also govern the effectiveness of capacitor tape 20. Ideally, dielectric layer 30 should be made as thin as possible, however, existing manufacturing process often limit how thin a dielectric material can be made reliably and repeatably. For a given dielectric material, the thickness of the material can be determined by the desired capacitance of the tape. While the thickness of dielectric layer 30 will depend on the actual material used and the desired capacitance, it is anticipated that a dielectric layer used in a capacitor tape in accordance with the present invention will be on the order of less than 4 mils (0.1 mm). In the example material above, barium-titanate filled plastic is manufacturable at a thickness of 2 mils (0.05 mm) and should be able to made thinner as manufacturing development progresses. Overall, it is anticipated that a capacitor tape used in accordance with the present invention will have a total thickness of less than about 8 mils (0.2 mm).

Capacitor tape 20 is bonded to leads 18 and to active surface 14 of die 12 by any one of existing processes used to adhesively bond leads in an LOC device. One method is to first attach the tape to the active die surface and subsequently attach the leads. Alternatively, the tape could first be attached to the leads and then attach the die to the tape. In FIG. 1, capacitor tape 20 exists as two separate portions 32 and 34 in order to accommodate centrally located bonding pads 16. The bonding pads should remain uncovered by the tape to allow the bonding pads to be electrically coupled to leads 18 and if appropriate to one of the capacitor electrodes. In embodiments of the present invention which utilize peripheral bonding pads, the capacitor tape can be unitary, as will become evident in the discussion of FIGS. 6 and 7.

Figure 3:
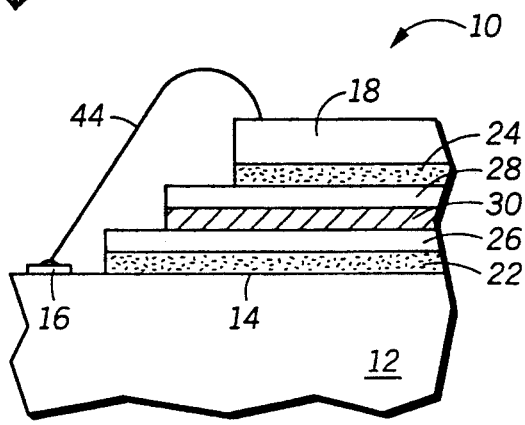
FIG. 3 is a cross-sectional view of a portion of an LOC semiconductor device in accordance with the present invention, demonstrating how a signal lead is electrically coupled to a semiconductor die.

As illustrated in FIG. 1, a plurality of bonding wires is used to electrically couple voltage leads (either power or ground leads) to the respective bonding pads via the appropriate capacitor electrodes. For example, a first bonding wire 36 is used to couple one lead to first conductive layer (first capacitor electrode) 26 while a second bonding wire 38 is used to couple the first electrode to its corresponding bonding pad 16. Likewise, a third bonding wire 40 is used to couple the other lead to second conductive layer (second capacitor electrode) 28 while a fourth bonding wire 42 is used to couple the second electrode to its corresponding bonding pad 16. Rather than using two separate bonding wires to electrically couple a lead to an electrode and a bonding pad, one continuous stitch bond (not illustrated) can be used. Bonding equipment can be programmed to form a ball bond on the bonding pad, a first stitch bond on the electrode, and a second stitch bond on the lead without severing the wire. In order to couple a signal lead to a bonding pad, the capacitor electrodes are by-passed altogether, as illustrated in FIG. 3 and only one bonding wire 44 is needed.

In a preferred embodiment of the invention, the uppermost conductive layer 28 is at ground potential such that the lead on the left in FIG. 1 would be a ground lead while the lowermost conductive layer 26 is a power plane and the lead on the right of FIG. 1 would be a power lead. It is important to note, however, that the upper electrode can instead be a power plane while the lower electrode can be a ground plane. In another embodiment of the present invention, a capacitor tape includes three conductive layers and two dielectric layers to form a tri-plate capacitor. For example, the uppermost and lowermost conductive layers would be ground planes while the middle conductive layer would be a power plane, thereby forming two capacitors with a common electrode.

As an alternative to the bonding wire configuration illustrated in FIG. 1, the present invention may be practiced using one of the bond wire configurations illustrated in FIGS. 4 and 5. In FIG. 1, the bonding wire configuration is lead-to-electrode and electrode-to-bonding pad. FIG. 4 illustrates another wiring option in which the configuration is lead-to-bonding pad and electrode-to-bonding pad. In other words, a first bonding wire 46 electrically couples lead 18 to bonding pad 16 and a second bonding wire 48 electrically couples one of the capacitor tape electrodes, namely first conductive layer 26, to bonding pad 16. The same configuration instead can be used to connect to the other capacitor electrode by extending bonding wire 48 between second conductive layer 28 and bonding pad 16. FIG. 5 illustrates yet another wiring option which utilizes a lead-to-bonding pad and lead-to-electrode bonding configuration. In FIG. 5, a first bonding wire 50 electrically couples lead 18 to bonding pad 16 and a second bonding wire 52 electrically couples lead 18 to first conductive layer 26. To achieve an electrical connection to the other capacitor electrode, second bonding wire 52 would instead extend between lead 18 and second conductive layer 28. The preferred wire bonding configuration for use in the present invention, from a performance point of view, is the configuration illustrated in FIG. 1 because total bonding wire length is minimized. By minimizing bonding wire length, inductance is also minimized. However, from a manufacturing point of view one of the other configurations may be more suitable.

Figure 2:
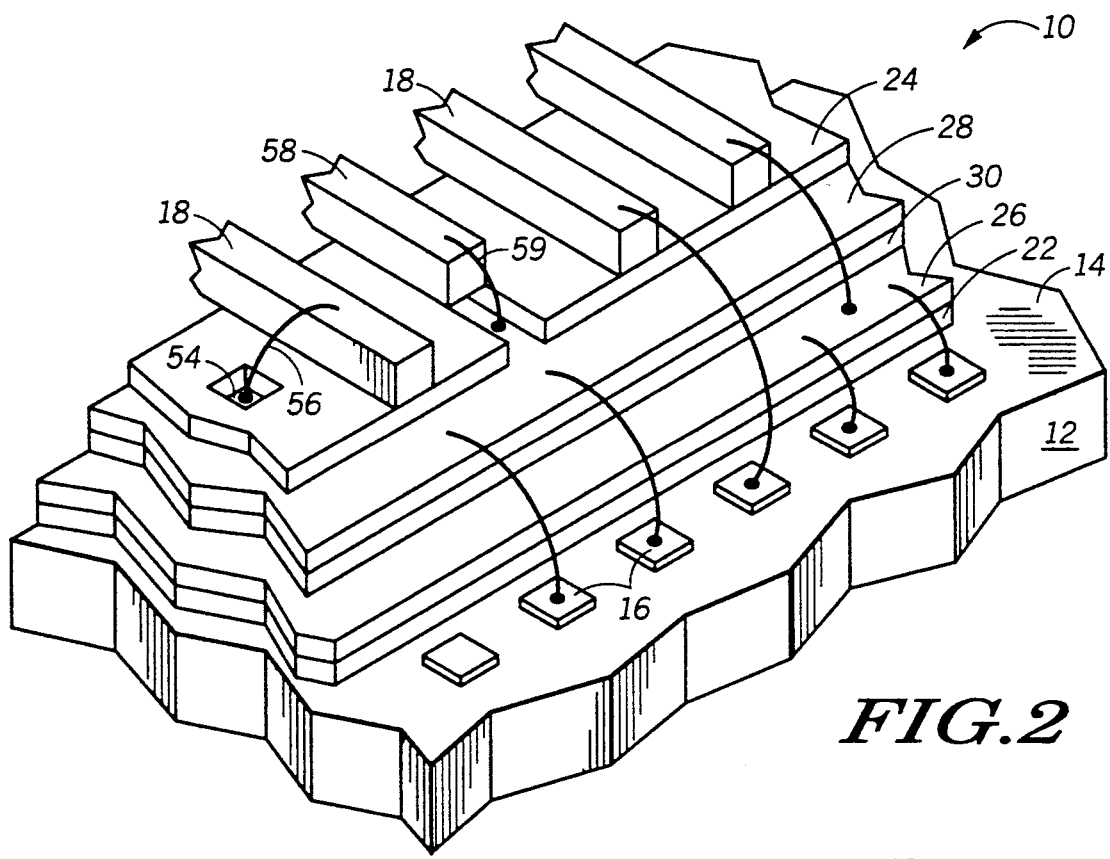
FIG. 2 is a perspective view of a portion of the semiconductor device illustrated in FIG. 1.

Other wire bonding options are also available in practicing the present invention, a couple of which are illustrated in FIG. 2. To achieve the largest capacitance, it is desirable to make the area of capacitor tape 20 as large as possible. Yet at the same time, it is important that there is sufficient space available to make the appropriate electrical connections by bonding wires. FIG. 2 illustrates ways in which capacitor tape 20 and/or leads 18 can be modified to facilitate the wire bonding process. For instance, an opening 54 can be formed in second adhesive layer 24 to permit a bonding wire 56 to be coupled between lead 18 and second conductive layer 28, thus freeing up space along the exposed portion of the upper electrode near the inner tips of leads 18 for other bonding wires. Similarly, space for wire bonding on the upper conductive layer can be created by shortening selected leads, for example lead 58, and likewise cutting back a portion of second adhesive 24 to accommodate a bonding wire 59.

FIGS. 6 and 7 illustrate in a cross-sectional view and a top-down view, respectively, a semiconductor device 60 also in accordance with the present invention in which a plurality of bonding pads 62 is located around the periphery of a semiconductor die 64. An adhesive capacitor tape 66 is used to adhesively bond a plurality of leads 68 to the die. Capacitor tape 66 is very similar to capacitor tape 20 described above except that it is not divided into two distinct segments but is instead unitary. Like capacitor tape 20, tape 66 includes a first and a second adhesive layer 70 and 72, respectively, a first and a second conductive layer 74 and 76, respectively, and a dielectric layer 78. As illustrated in FIG. 6, there is ample space between leads 68 to accommodate a bonding wire 80 which electrically couples one of the leads to second conductive layer 76. In order to couple lead 68 to the first conductive layer, a bonding wire 82 extends between lead 68 and an adjacent lead to the lower capacitor electrode, as illustrated in FIG. 7. A bonding wire 84 is then used to electrically couple the lower electrode to bonding pad 62. Alternatively, a bonding wire (not shown) could be used to directly couple lead 68 to bonding pad 62. Yet another alternative, also not illustrated, is to include a first bonding wire between lead 68 and bonding pad 62 and a second bonding wire between bonding pad 62 and first conductive layer 74. Each of these alternatives is described in more detail above in reference to the wiring options available for use in practicing the present invention.

The foregoing description and illustrations contained herein demonstrate many of the advantages associated with the present invention. In particular, it has been revealed that a decoupling capacitor can be incorporated internally into an LOC device as an adhesive capacitor tape. Such a tape is advantageous over existing decoupling capacitors because the capacitor is as close as possible to the active surface and because the tape is extremely thin. Use of a thin capacitor is beneficial from a performance point of view because capacitance is increased as the dielectric thickness in the capacitor is decreased. Another benefit is that the tape does not substantially add to the total thickness or profile of the LOC device. Yet another advantage is that the present invention does not create additional manufacturing steps in comparison to existing LOC assembly techniques. Further, the cost of a capacitor tape used in accordance with the present invention is not unreasonable because manufacturing technology today exists to make such a tape.

Thus it is apparent that there has been provided, in accordance with the invention, a lead-on-chip semiconductor device, and method for making the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, additional adhesive layers may be utilized in the capacitor tape. Depending on the dielectric and electrode materials used, adhesive layers may be necessary or useful in between the dielectric layer and the electrodes. In addition, the invention may be practiced having either the uppermost electrode as a ground plane and the lowermost electrode as a power plane or vice-versa. Moreover, more than two conductive layers and more than one dielectric layer can be implemented in a capacitor tape used in accordance with the present invention. Another variation that is within the scope of the present invention is a combination of peripheral and centrally located bonding pads on the same semiconductor die. Furthermore, there may be alternative ways to electrically couple power and ground leads to respective capacitor electrode which have not been explicitly described but are nonetheless within the scope of the invention. Also, not every power nor every ground lead in a device needs to be coupled to an electrode. For instance, it maybe sufficient to only couple "noisy" power and "noisy" ground leads to the appropriate electrodes. It is also important to note that the present invention may be practiced in a chip-on-lead (COL) device rather than in an LOC device. In a COL application, the capacitor tape would be adhesively coupled to the backside or non-active surface of the die, and leads would extend beneath the die and be bonded to the tape. To establish electrical connection to the electrodes of the tape, the tape would be made larger than the die to establish a bonding region. Therefore, it is intended that this invention encompass all such variations and modifications as fall within the scope of the appended claims.

What is claimed is:

1. A lead-on-chip semiconductor device comprising:
   a semiconductor die having an active surface a periphery, and a central region, and having a plurality of signal bonding pads and a first and a second voltage bonding pad on the active surface;
   a capacitor tape having a thickness of less than approximately 0.2 millimeters attached to the active surface of the die, the capacitor tape comprising:
      a first adhesive layer;
      a first conductive layer overlying the first adhesive layer which serves as a first capacitor electrode;
      a dielectric layer overlying the first conductive layer;
      a second conductive layer overlying the dielectric layer which serves as a second capacitor electrode; and
      a second adhesive layer overlying the second conductive layer;
   a plurality of signal leads attached to the second adhesive layer;
   a plurality of signal bonding wires electrically coupling the plurality of signal leads to the plurality of signal bonding pads;
   a first voltage lead attached to the second adhesive layer and electrically coupled to the first capacitor electrode;
   a second voltage lead attached to the second adhesive layer and electrically coupled to the second capacitor electrode;
   means for electrically coupling the first voltage bonding pad to the first capacitor electrode; and
   means for electrically coupling the second voltage bonding pad to the second capacitor electrode.

2. The semiconductor device of claim 1 wherein the first voltage lead is electrically coupled to the first capacitor electrode by a first bonding wire which extends between the first voltage lead and the first voltage bonding pad and a second bonding wire which extends between the first voltage bonding pad and the first capacitor electrode.

3. The semiconductor device of claim 1 wherein the second voltage lead is electrically coupled to the second capacitor electrode by a first bonding wire which extends between the second voltage lead and the second voltage bonding pad and a second bonding wire which extends between the second voltage bonding pad and the second capacitor electrode.

4. The semiconductor device of claim 1 wherein the first voltage lead is electrically coupled to the first capacitor electrode by a first bonding wire which extends between the first voltage lead and the first capacitor electrode and wherein the means for electrically coupling the first voltage bonding pad to the first capacitor electrode is a second bonding wire which extends between the first capacitor electrode and the first voltage bonding pad.

5. The semiconductor device of claim 1 wherein the second voltage lead is electrically coupled to the second capacitor electrode by a first bonding wire which extends between the second voltage lead and the second capacitor electrode and wherein the means for electrically coupling the second voltage pad to the second capacitor electrode is a second bonding wire which extends between the second capacitor electrode and the second voltage bonding pad.

6. The semiconductor device of claim 1 wherein the first capacitor electrode serves as a power plane and wherein the second capacitor electrode serves as a ground plane.

7. The semiconductor device of claim 1 wherein at least one of the voltage bonding pads is formed on the active surface within the central region, and wherein the capacitor tape is sectioned on the active surface of the chip to provide accessibility to the at least one voltage bonding pad within the central region.

8. The semiconductor device of claim 1 wherein the capacitor tape comprises a dielectric material having a dielectric constant greater than approximately thirty.

9. The semiconductor device of claim 8 wherein the dielectric layer of the capacitor tape comprises barium-titanate ($BaTiO_3$).

10. The semiconductor device of claim 8 wherein the first and second conductive layers of the capacitor tape each comprise a copper foil.

11. A semiconductor device comprising:
    a semiconductor die having a surface with a periphery and a central region, and having a plurality of bonding pads located within the central region;
    an adhesive capacitor tape having a thickness of less than approximately 0.2 millimeters comprising a first and a second adhesive layer, a first and second a capacitor electrode between the first and second adhesive layers, and a dielectric layer between the first and second capacitor electrodes, wherein the first adhesive layer of the capacitor tape is attached to the surface of the die such that the plurality of bonding pads within the central region is exposed;

a plurality of leads attached to the second adhesive layer of the capacitor tape;

means for electrically coupling a first lead of the plurality of leads to the first capacitor electrode and to a first bonding pad of the plurality of bonding pads;

means for electrically coupling a second lead of the plurality of leads to the second capacitor electrode and to a second bonding pad of the plurality of bonding pads; and wherein the first lead is a ground lead and the second lead is a power lead.

12. The semiconductor device of claim 11 wherein the means for electrically coupling the first lead to the first capacitor electrode and to the first bonding pad comprises a first bonding wire which extends between the first lead and the first capacitor electrode and a second bonding wire which extends between the first capacitor electrode and the first bonding pad.

13. The semiconductor device of claim 11 wherein the means for electrically coupling the second lead to the second capacitor electrode and to the second bonding pad comprises a first bonding wire which extends between the second lead and the second capacitor electrode and a second bonding wire which extends between the second capacitor electrode and the second bonding pad.

14. The semiconductor device of claim 11 wherein the surface of the semiconductor die is an active surface.

15. The semiconductor device of claim 11 wherein the plurality of bonding pad within the central region divide the semiconductor die into a first portion and a second portion, and wherein the device comprises a first capacitor tape adhesively bonded to the surface of the die overlying the first portion and further comprises a second capacitor tape adhesively bonded to the surface of the die overlying the second portion, and wherein the first and second capacitor tapes are positioned such that the plurality of bonding pads in the central region remain accessible.

16. The semiconductor device of claim 11 wherein the first and second capacitor electrodes of the capacitor tape each comprise a copper foil, and wherein the dielectric layer of the capacitor tape comprises a material having a dielectric constant greater than approximately thirty.

17. The semiconductor device of claim 16 wherein the dielectric layer of the capacitor tape comprises barium-titanate ($BaTiO_3$).

* * * * *